United States Patent
Vijayendran (12)

(10) Patent No.: US 6,326,297 B1
(45) Date of Patent: Dec. 4, 2001

(54) METHOD OF MAKING A TUNGSTEN NITRIDE BARRIER LAYER WITH IMPROVED ADHESION AND STABILITY USING A SILICON LAYER

(75) Inventor: Anil Justin Vijayendran, Campbell, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/410,176

(22) Filed: Sep. 30, 1999

(51) Int. Cl.[7] .................... H01L 21/4763; H01L 21/44
(52) U.S. Cl. .................... 438/627; 438/628; 438/630; 438/638; 438/639; 438/643; 438/644; 438/653; 438/654; 438/656; 438/672; 438/675; 438/680; 438/685; 438/687
(58) Field of Search ...................... 438/627–631, 438/597, 618, 637–640, 643–644, 653–656, 680, 685, 672, 675, 687

(56) References Cited

U.S. PATENT DOCUMENTS

| | | | |
|---|---|---|---|
| 5,341,016 | * | 8/1994 | Prall et al. ............................. 257/412 |
| 5,888,588 | * | 3/1999 | Nagabushnam et al. ............ 427/247 |
| 5,989,623 | * | 11/1999 | Chen et al. ............................ 427/97 |
| 6,066,540 | * | 5/2001 | Yeom et al. .......................... 438/396 |

* cited by examiner

Primary Examiner—Ha Tran Nguyen
(74) Attorney, Agent, or Firm—Skjerven Morrill MacPherson LLP; Christopher B. Allenby

(57) ABSTRACT

Tungsten nitride adhesion to an underlying dielectric is enhanced by forming a thin layer of silicon over the dielectric before depositing the tungsten nitride. A twenty angstrom layer of amorphous silicon is formed over a silicon oxide dielectric. Tungsten nitride is formed over the silicon layer using a plasma enhanced chemical vapor deposition with tungsten hexafluoride and nitrogen. As the tungsten nitride is formed, the tungsten hexafluorine and nitrogen reacts with the amorphous silicon to produce an adhesion layer that includes silicon nitride and tungsten silicide.

15 Claims, 5 Drawing Sheets

METHOD OF MAKING A TUNGSTEN NITRIDE BARRIER LAYER WITH IMPROVED ADHESION AND STABILITY USING A SILICON LAYER

BACKGROUND

1. Field of Invention

The present invention relates to integrated circuit structures and fabrication methods, and in particular to enhancing tungsten nitride adhesion to an underlying dielectric.

2. Related Art

The semiconductor industry is moving toward copper interconnects to produce faster and less expensive integrated circuits. However, manufacturing fully integrated copper devices presents formidable technical challenges. One critical manufacturing aspect is the choice of barrier material. Copper readily diffuses into interlayer dielectrics, and the diffusion may result in line-to-line leakage and integrated circuit device damage.

Physical vapor deposited (PVD) tantalum (Ta) and tantalum nitride (TaN) liners have been experimented with as copper barriers for 0.25 μm and 0.18 μm device generations. These materials have a nearly amorphous texture that impedes copper diffusion. However, the drawback of the PVD techniques, including ionized PVD, is poor sidewall coverage in high aspect ratio, dual damascene features. The industry requires conformal, highly reliable copper barriers.

Tungsten nitride is a potential copper barrier. When deposited using plasma enhanced chemical vapor deposition (PECVD), tungsten nitride provides good conformal coverage in high aspect ratio features. Unfortunately, tungsten nitride is not thermally stable when deposited on dielectric materials such as silicon dioxide. During high temperature process steps (e.g., annealing after electrochemical plating of copper) following the tungsten nitride deposition, the tungsten nitride separates from the dielectric. What is required is a method to improve the tungsten nitride's thermal stability and adhesion to the underlying dielectric.

SUMMARY

In accordance with the invention, a layer of silicon is formed over the dielectric before the tungsten nitride is deposited. The invention may be used in various applications involving one or more layers of tungsten nitride. Such applications include, for example, dual damascene copper interconnect structures and electrically conductive gates for insulated gate transistors.

A conventional dielectric layer (e.g., silicon dioxide) is formed over a semiconductor substrate. In some embodiments the dielectric layer may be patterned to form, for example, a damascene structure. A thin layer of silicon is formed over the dielectric layer. In some embodiments the silicon layer is amorphous silicon. In other embodiments the layer of silicon may have a different physical structure. Tungsten nitride is formed over the silicon layer using plasma enhanced chemical vapor deposition (PECVD). During the deposition, tungsten hexafluorine ($WF_6$) and nitrogen ($N_2$) react to form the tungsten nitride layer. In addition, silicon in the silicon layer is consumed by reacting with the $N_2$ to form silicon nitride, and with the $WF_6$ to form tungsten silicide and silicon tetrafluoride. The silicon nitride and tungsten silicide remain between the dielectric and the tungsten nitride to form an adhesion layer. The volatile silicon tetrafluoride is carried away during the PECVD process.

DETAILED DESCRIPTION

Portions of the accompanying drawings have been omitted, and elements are not shown to scale, so as to more clearly describe the invention.

Figure 1:
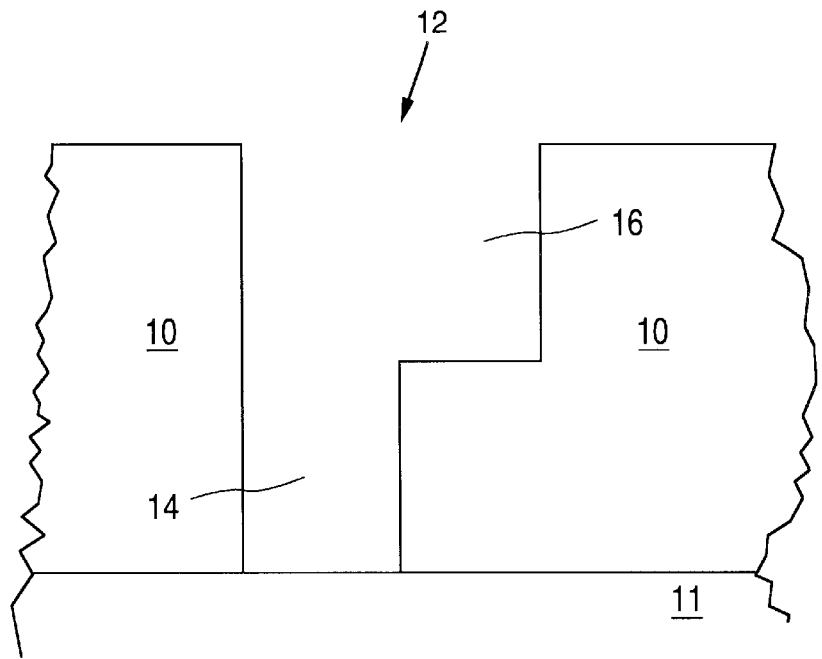
FIGS. 1–6 are cross-sectional views showing a sequence of actions forming an embodiment of the invention.

FIG. 1 is a cross-sectional view showing a conventional dielectric layer 10. Dielectric layer 10 is formed over, for example, a semiconductor substrate 11 in which active integrated circuit devices (not shown) are formed. Layer 10 is silicon dioxide ($SiO_2$) in the depicted embodiment. Other embodiments may use other silicon-based dielectric materials, or other conventional dielectric materials. In some embodiments layer 10 includes several conventional layers (not shown) used during conventional damascene structure formation.

Conventional dual damascene structure 12 is shown formed in dielectric layer 10. Damascene 12 includes a via portion 14 and a trench portion 16. Damascene 12 is formed using conventional methods. As shown, via portion 14 extends through dielectric layer 10 to substrate 11. In other embodiments, via 14 may not completely extend through layer 10. In some embodiments damascene 12 has a depth:width aspect ratio that is relatively aggressive (e.g., in excess of 4:1).

Figure 2:
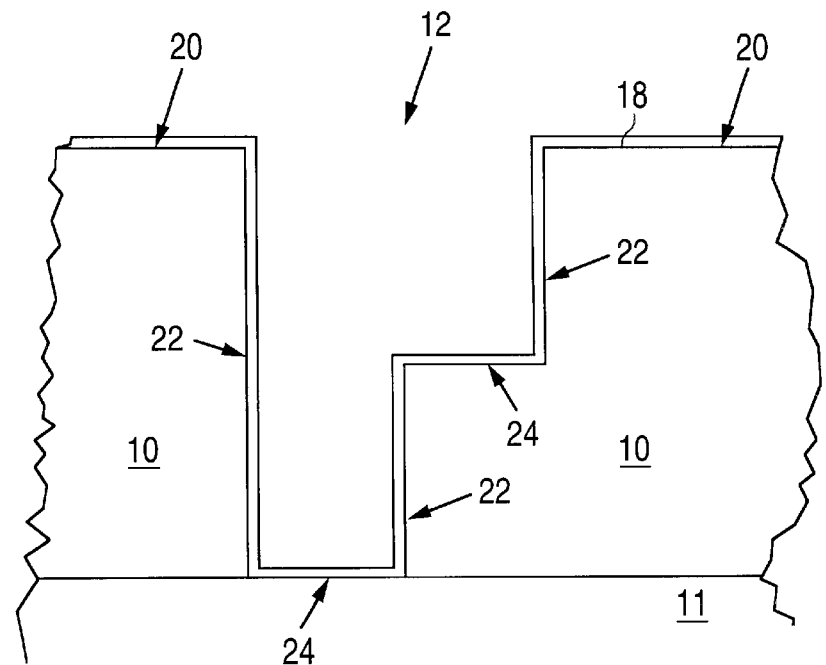

FIG. 2 shows amorphous silicon layer 18 formed over dielectric layer 10. As depicted, amorphous silicon layer 18 covers dielectric layer 10's top surface 20, and damascene 12's vertical walls 22 and fields 24. In one embodiment silicon layer 18 is approximately twenty angstroms (20 Å) thick. In other embodiments silicon layer 18 may be thicker. Since measuring a 20 Å is difficult, the 20 Å thickness can be estimated by determining the time required to form a thicker (e.g., 200 Å) layer, and decreasing the time by an appropriate divisor (e.g., 10). Layer 18 should be sufficiently thick to prevent $WF_6$ from reacting with dielectric layer 10. However, layer 18 thickness should be minimized to prevent increased resistivity. Experiments have shown 20 Å to be sufficient. Silicon layer 18 is formed by a conventional thermally or radio frequency (RF) driven reaction of silane ($SiH_4$) and hydrogen ($H_2$) at 325° C. using 50 sccm $SiH_4$, 200 sccm $H_2$, and 30 Watts power.

Figure 3:
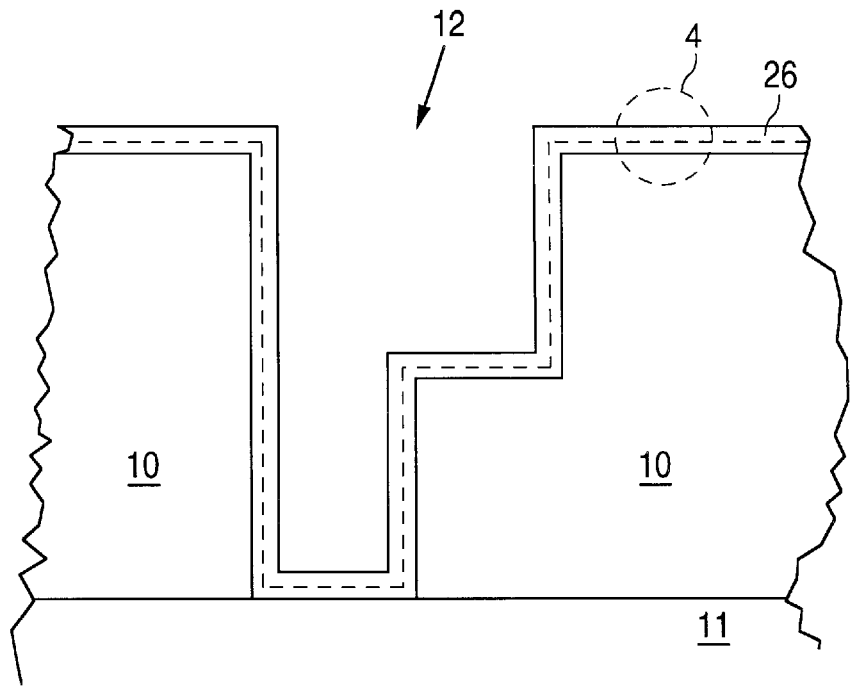

FIG. 3 shows tungsten nitride ($WN_x$) barrier layer 26 formed over amorphous silicon layer 18. Barrier layer 26 thickness is sufficient to prevent copper atoms from migrating into dielectric layer 10 or substrate 11 during subsequent processing steps. In some embodiments barrier layer 26 is approximately one-hundred angstroms (100 Å) thick. In one embodiment barrier layer 26 is conventional formed with a plasma enhanced chemical vapor deposition (PECVD) using a manually controlled, single wafer, parallel plate reactor. However, conventional automated tungsten deposition tools, such as the ALTUS tool manufactured by NOVELLUS, Inc., the present assignee, may be configured to perform the $WN_x$ deposition. As discussed below, the ratio or nitrogen atoms to tungsten atoms (N:W) in the $WN_x$ should be approximately 0.3 (3.33:1) for optimal barrier performance. This N:W ratio is achivied at 325° C. using, a $N_2$:$WF_6$ flow ratio of 5:1 with $N_2$ at 38 sccm and $WF_6$ at 7.5 sccm, 200 sccm $H_2$, and 200 Watts power. During barrier layer 26 formation the $WF_6$ reacts with the silicon in layer 18 to form several compounds, and composite adhesion layer 18A remains.

Figure 4:
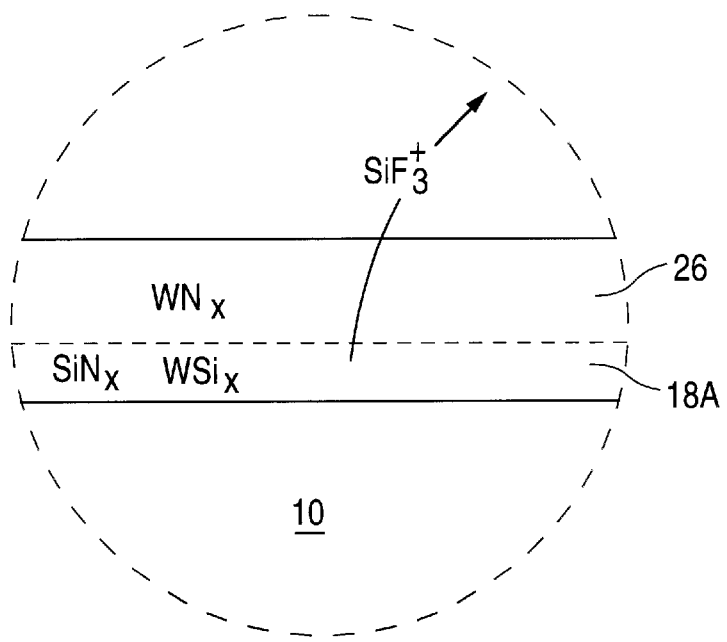

FIG. 4 is a detailed view of the area in dashed circle 4 shown in FIG. 3. As depicted, layers 26 and 18A are separated by a dashed line to signify that reactions have occurred during $WN_x$ barrier layer formation. Thus, the boundary between layers 26 and 18A is not distinct. Adhesion layer 18A occupies approximately the same position as did layer 18 before the silicon in layer 18 reacted with the $WF_6$ and $N_2$.

Silicon in layer 18 is consumed (reacted away) during $WN_x$ barrier layer 26 deposition. Therefore silicon nitride ($SiN_x$) and tungsten silicide ($WSi_x$) remains in adhesion layer 18A. Additional silicon from layer 18 reacts to form silicon tetrafluoride molecules ($SiF_4$) that are removed from the resulting structure. Adhesion layer 18A promotes adhesion between $WN_x$ barrier layer 26 and dielectric layer 10, and promotes $WN_x$ barrier layer metallurgical stability, during subsequent high temperature process steps (e.g., annealing after electrochemical plating of copper).

Figure 5:
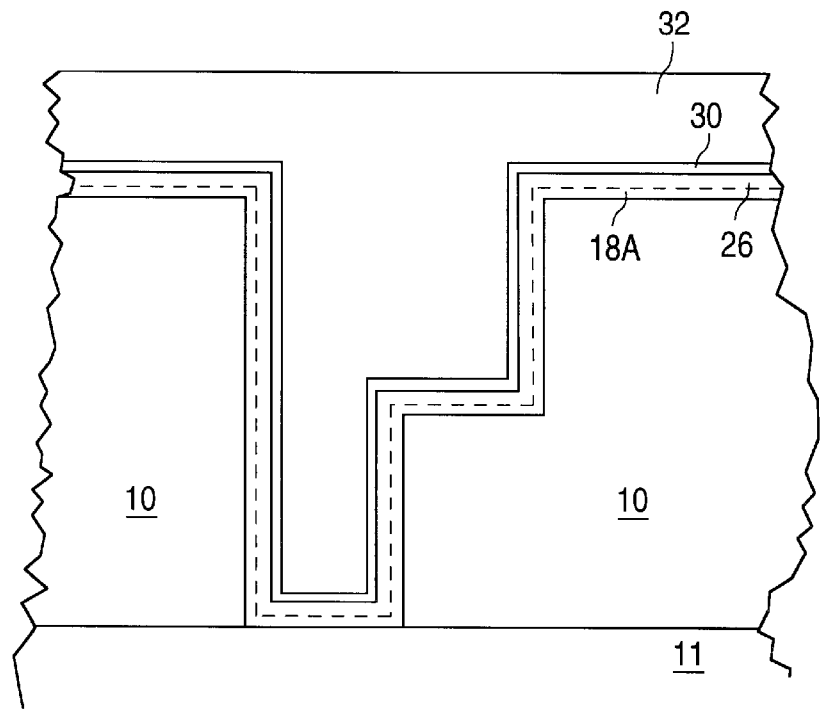

FIG. 5 shows the result of a conventional electrochemical plating (ECP) process depositing copper. A conventional seed layer 30 is deposited to cover barrier layer 26. Copper layer 32 is then deposited using, for example, conventional ECP methods. In some embodiments pure copper is used. Other embodiments may use copper alloys.

Figure 6:
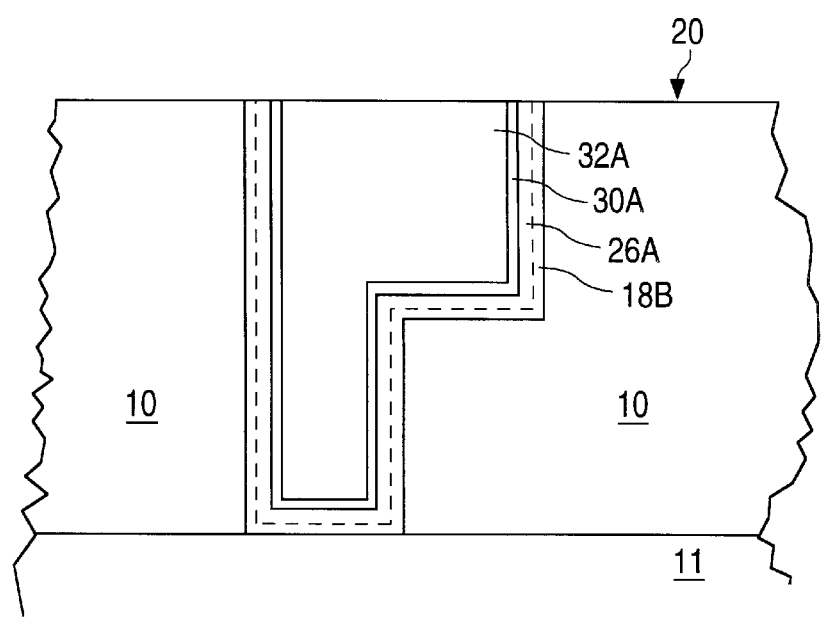

Finally, as shown in FIG. 6, top portions of copper layer 32, seed layer 30, barrier layer 26 and adhesion layer 18A are removed using, for example, a conventional chemical-mechanical polishing (CMP) process, to expose top surface 20 of dielectric layer 10. Copper layer portion 30A, seed layer portion 30A, $WN_x$ barrier layer portion 26A, and adhesion layer portion 18B remain in damascene 12. Additional process steps may be carried out following the CMP.

Embodiments of the invention are not limited to use with integrated circuit copper interconnects. The invention provides enhanced $WN_x$ adhesion and stability in a variety of applications. For example, $WN_x$ may be used to form insulated gate transistors.

Figure 7:
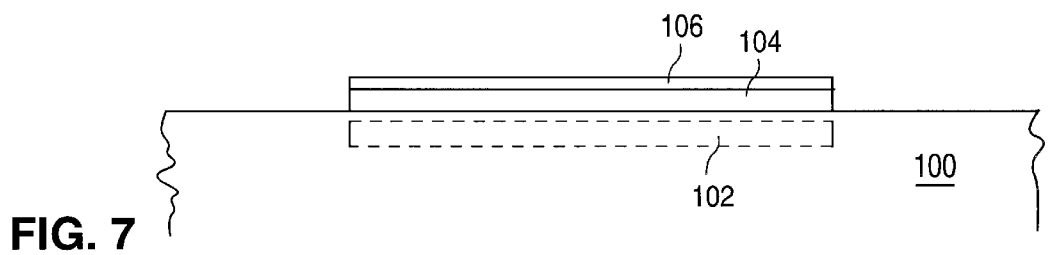
FIGS. 7 and 8 are cross-sectional views showing a sequence of actions forming a second embodiment of the invention.

FIG. 7 is a cross-sectional view of a semiconductor substrate (e.g., silicon) 100. A channel region 102 is defined in substrate 100 for an insulated gate transistor (not shown). An insulating layer (e.g., silicon dioxide ($SiO_2$)) is conventionally formed to produce conventional gate dielectric layer 104 over channel region 102. Amorphous silicon layer 106 is deposited on layer 104 as described above to approximately 20 Å thickness. Persons skilled in semiconductor device fabrication will understand various methods used to pattern layers 104 and 106, and subsequent layers, of this embodiment.

Figure 8:
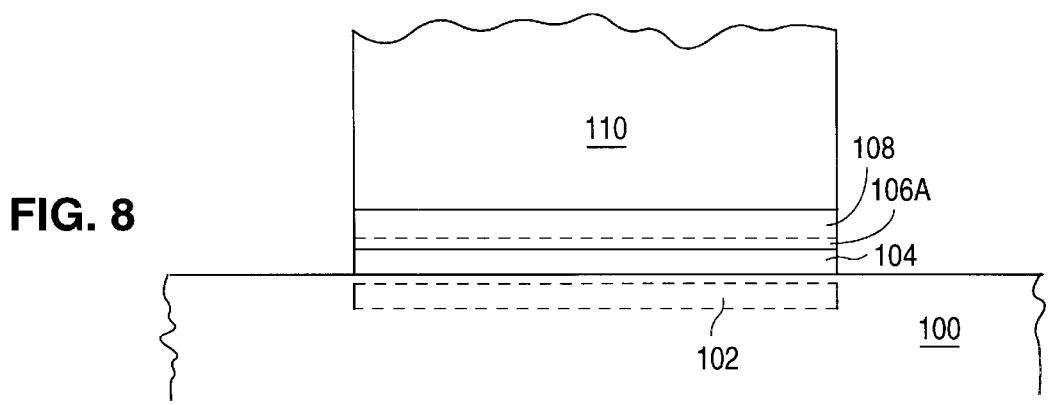

FIG. 8 shows $WN_x$ layer 108 formed over dielectric layer 104. In some embodiments layer 104 is approximately 100 Å thick. As described above, $WF_6$ and $N_2$ used to form $WN_x$ layer 108 reacts with the silicon in layer 106 (FIG. 7). The reaction produces, among other things, $SiN_x$ and $WSi_x$, which remain in adhesion layer 106A, and $SiF_4$ which is ejected from the structure. Accordingly, the boundary between adhesion layer 106A and $WN_x$ layer 108 is not exactly defined, as represented by the dashed line shown between layers 106A and 108, because some $WN_x$ may exist in the area previously occupied by silicon layer 106 (FIG. 7). $WN_x$ layer 108 provides a smaller resistivity than conventional $WSi_x$ or $TiSi_x$ layers.

Following $WN_x$ layer 108 formation, a conductive plug 110 is formed over $WN_x$ layer 108. In some embodiments plug 110 is tungsten. An electric potential applied to the combination of plug 110 and layer 108 controls current flow in channel 102.

Testing revealed the benefit of forming the $WN_x$ film over silicon rather than over silicon oxide. Testing was performed to determine $WN_x$ film characterization, metallurgical stability, electrical reliability, and barrier performance. For evaluation, $WN_x$ film thickness was measured by spectroscopic ellipsometry and verified on multiple samples by scanning electron microscope (SEM). $WN_x$ film stoichiometry was determined by Rutherford backscattering (RBS) in the channeling configuration on samples having 300 Å $WN_x$ over silicon substrate. Film roughness was measured by atomic force microscopy (AFM) on samples having 100 Å $WN_x$ over $SiO_2$.

Tests were first performed to evaluate $WN_x$ deposited on silicon substrate. Tests were then performed to evaluate $WN_x$ deposited on $SiO_2$. When electrical reliability testing of $WN_x$ deposited on $SiO_2$ revealed almost immediate failure, the cause of barrier breakdown was investigated.

Using a single wafer, parallel plate reactor, various process parameter ranges were used to form $WN_x$ over silicon substrate. Temperature varied from 275–400° C., pressure from 0.45–2.5 Torr, RF power from 30–200 W, the $N_2$:$WF_6$ flow ratio from 1:1–12:1, and the $H_2$ flow from 100–600 sccm.

An amorphous silicon layer was formed on the $SiO_2$ using conventional silane soak processes. The process windows used for the soak were 300–350° C., 0.3–0:8 Torr, 30–200 W, 10–200 sccm $H_2$, and 10–100 sccm $SiH_4$.

Figure 9:
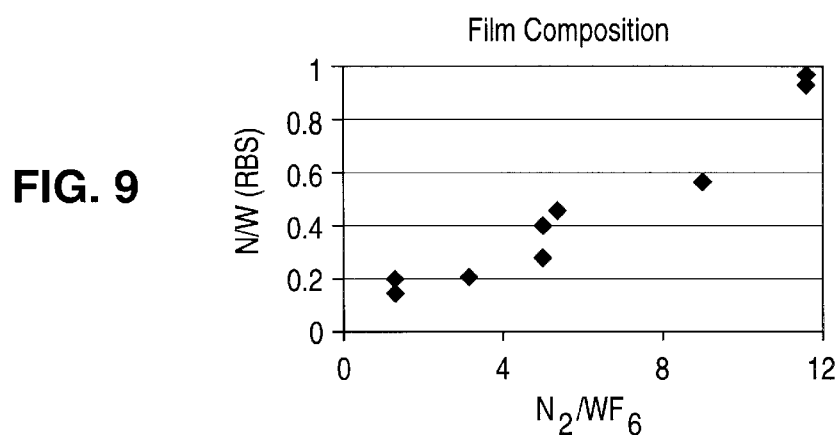
FIG. 9 is a graph showing a relationship between a tungsten/nitrogen ratio and a nitrogen/tungsten hexafluorine ratio.
Figure 10:
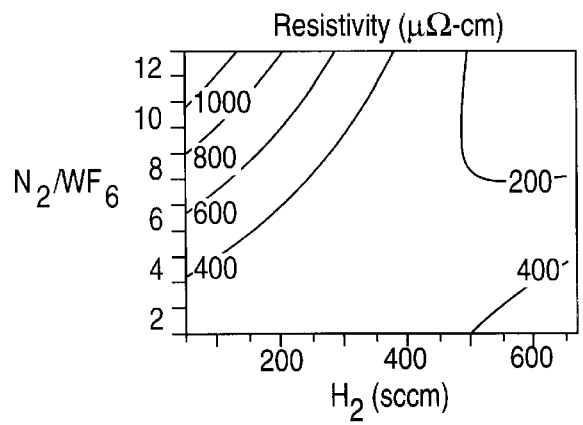
FIG. 10 is a graph showing relationships among a nitrogen/tungsten hexafluorine ratio, a hydrogen process flow, and resistivity.

Regarding the $WN_x$ film itself, the $N_2$:$WF_6$ flow ratio was the primary factor that controlled the $WN_x$ film composition and resistivity. Increasing the nitrogen flow increased both film resistivity and the N:W stoichiometry, as shown in FIG. 9. Hydrogen flow also controlled resistivity. An increased hydrogen flow decreased bulk resistivity, as shown in FIG. 10.

Figure 11:
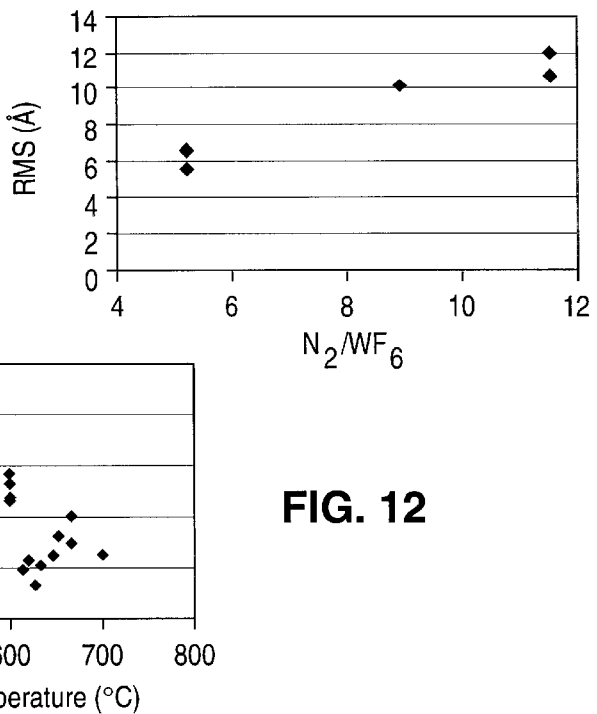
FIG. 11 is a graph showing a relationship between film thickness and a nitrogen/tungsten hexafluorine ratio.

The $N_2$:$WF_6$ flow ratio is also apparently a significant parameter in determining surface roughness, as shown in FIG. 11. AFM analysis on planar $WN_x$ films indicated that decreasing nitrogen flow yields a smoother surface. Sidewall morphology is important because rough or discontinuous sidewall film will lead to integration problems and early barrier failure. SEM photographs of $WN_x$ films in 0.3 µm 3.3:1 aspect ratio trenches indicated that the sidewall was rougher than the field. By decreasing pressure from 2.5 Torr to 0.5 Torr, smoother sidewalls were obtained. However, AFM analysis on the sidewall of a 0.5 Torr process $WN_x$ film showed that the film sidewall surface was still rougher than the field. Nevertheless, Auger Electron Spectroscopy (AES) data revealed that the N/W composition of the $WN_x$ film was identical in the field and sidewall portions, demonstrating that plasma directionality in the PECVD process did not affect composition. Table I shows composition and morphology data on a trench sidewall using a 0.5 Torr process. Root mean square (RMS) of the sidewall without the $WN_x$ film was 6.0 Å.

TABLE I

| Analysis Point | AFM RMS (Å) | Relative composition AES |
|---|---|---|
| Field | 8.5 | 0.10 |
| Sidewall | 16.9 | 0.09 |
| Bottom | — | 0.9 |

Barrier performance was tested using samples of $WN_x$ film over silicon substrate. To test metallurgical stability, $WN_x$ barrier failure was measured by monitoring changes in sheet resistance ($R_s$) with a four-point probe. The film breakdown temperature was defined as the temperature at which the post-anneal $R_s$ increased above the pre-anneal $R_s$ value. The $Si/WN_x/Cu$ stacks were annealed in high vacuum (approximately $10^{-6}$ Torr) for 1 hour at temperatures ranging from 400–700° C.

The early stage of barrier breakdown was detected using conventional surface ionization mass spectroscopy (SIMS) analysis. The $Si/WN_x/Cu$ stacks were annealed at 500° C. for one hour under vacuum. The copper was then stripped using diluted nitric acid and the $WN_x$ barrier was removed using a $NF_3/N_2$ reactive ion etch. SIMS analysis was performed on the remaining silicon to determine copper contamination. Results were compared against a reference unannealed $Si/WN_x/Cu$ stack.

Figure 12:
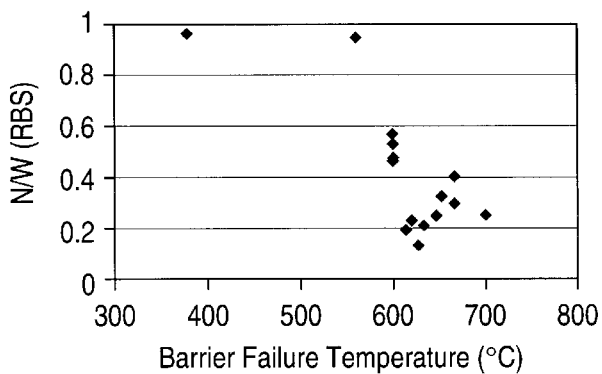
FIG. 12 is a graph showing a relationship between a nitrogen/tungsten ratio and barrier failure temperatures.

The N:W ratio in the $WN_x$ film apparently has a significant impact on barrier stability, as shown in FIG. 12. $WN_x$ films with a N:W ratio between 0.3 and 0.4 had a breakdown temperature of 690° C. after annealing for 1 hour. SIMS data confirms optimal barrier performance for films with a N:W ratio between 0.3 and 0.4 and resistivities ranging from 300–350 $\mu\Omega$-cm. $WN_x$ films with these compositions showed no significant diffusion of copper into the substrate as both the annealed sample and reference sample had the same copper atom density per unit area (approximately $1*10^{13}$ atoms/cm$^2$). $WN_x$ films with N/W composition between 0.4 and 0.5 showed 45–60 times as much copper in the sample substrate than in the reference substrate. These results differ from those reported in P. J. Pokela, et al., Applied Physics Letters 53 (1991), stating the optimal N:W ratio is 0.5 in physical vapor deposition (PVD) formed $WN_x$ barrier tests.

The electrical reliability of $WN_x$ was tested using samples in which the $WN_x$ film was deposited directly on $SiO_2$. The $SiO_2$ layer was deposited over a silicon wafer and a 2.5 mm diameter test pad damascene was formed in, but not extending through, the $SiO_2$. A 100 Å $WN_x$ layer was formed on the $SiO_2$, followed by copper seed layer deposition after air break. The structure was electroplated with 1 $\mu$m of copper and subsequently polished using CMP to expose the original top surface of the underlying $SiO_2$ layer. The back side of the silicon wafer was stripped using HF and PVD titanium (Ti) was deposited to provide electrical contact. Several samples were formed and tested. Prior to testing the samples were annealed at 300° C. in a nitrogen ambient to heal defects at the oxide/barrier interface. The bias-temperature stress (BTS) test conditions were 20 V at 200° C. BTS testing was done on $WN_x$ films having a N:W ratio of 0.3.

BTS test data showed that samples with and without a $WN_x$ barrier had the same lifetime, showing that the $WN_x$ did not impede copper ion diffusion. Failure analysis revealed that the barrier failed prior to bias stressing, suggesting that the barriers failed during the 300° C. anneal.

Further investigation showed that although films deposited on silicon were stable at temperatures up to 690° C., the $WN_x$ layer delaminated from oxide substrates upon annealing at 550° C. for one hour. After quantifying barrier failure temperature, the relationship between barrier failure and fluorine impurity was investigated. Silicon and 100 Å $WN_x$ stacks were annealed at 500° C. and volatile film contaminants were monitored using a conventional temperature desorption mass spectrometry (TDS) system. TDS analysis showed that fluorine impurity degraded barrier performance.

Figure 13:
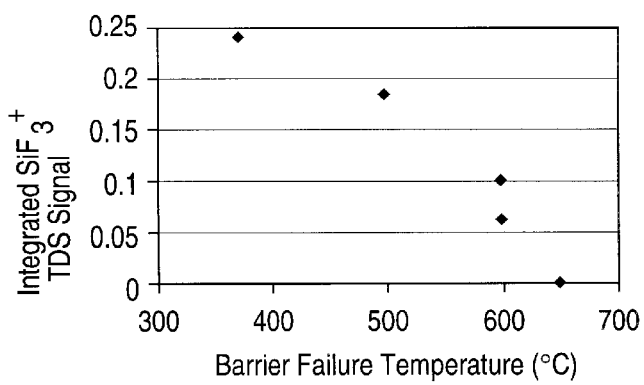
FIG. 13 is a graph showing a relationship between an integrated $SiF_3^+$ TDS signal and barrier failure temperatures.

Fluorine incorporated in the $WN_x$, qualitatively measured by an integrated TDS $SiF_3^+$ signal, apparently degrades barrier performance. Fluorinated species react at high temperature, and the outgassing species may create defects in the $WN_x$ film. If the fluorine content is very high the $WF_6$ contaminants may attack the substrate underlying the $WN_x$ film and the film will delaminate during subsequent thermal processing steps. FIG. 13 shows the effect of fluorine content, measured as the $SiF_3^+$ signal using TDS, on barrier breakdown temperature as measured by sheet resistance change.

The level of hydrogen flow during $WN_x$ deposition can control bulk fluorine impurity. The hydrogen reacts with the fluorine to form HF that is later desorbed. High hydrogen flow with respect to a constant $N_2$:$WF_6$ flow ratio decreases resistivity and the presence of fluorine impurity. Table II shows example results.

TABLE II

| $H_2$:$WF_6$ Ratio | Resistivity ($\mu\Omega$-cm) | Bulk F Content (atoms/cm$^2$) |
|---|---|---|
| 7 | 1620 | $2 * 10^{21}$ |
| 13 | 690 | $9 * 10^{20}$ |
| 27 | 320 | $2 * 10^{20}$ |

Figure 14:
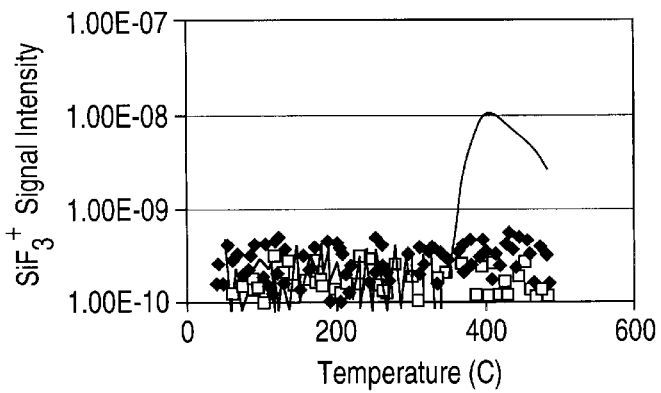
FIG. 14 is a graph showing a relationship between an $SiF_3^+$ signal intensity and temperature.

Fluorine impurity is also apparently controlled by forming the $WN_x$ layer on silicon. When monitoring the fluorine outgassing with TDS, a higher interfacial fluorine concentration in the $WN_x$/oxide sample was indicated by a strong $SiF_3^+$ peak, as shown in FIG. 14. However, the $WN_x$/Si sample did not exhibit such a peak. It appears that silicon from the substrate reacts with the $WF_6$ to form $WSi_x$ and $SiF_4$ which desorbs from the $WN_x$ film during deposition. During testing a thin silicon layer formed on an oxide layer showed similar $SiF_3^+$ test results as the $WN_x$/Si sample. In contrast, the oxide substrate has fewer free silicon atoms to reduce the $WF_6$, and consequently fluorine remains at the $WN_x$/oxide interface and outgasses during thermal cycling.

The present invention has been described using specific embodiments. Many variations of the invention exist, however, and the invention is limited only by the scope of the following claims.

I claim:

1. An integrated circuit fabrication method comprising the acts of:
   providing a semiconductor substrate;
   forming a dielectric layer over the semiconductor substrate;
   forming a layer of amorphous silicon on the dielectric layer;
   forming a tungsten nitride layer on the layer of amorphous silicon; and forming an adhesion layer between the tungsten nitride layer and the dielectric layer, the adhesion layer comprising silicon nitride and tungsten silicide, wherein silicon in the silicon nitride and tungsten silicide is at least in part from the amorphous silicon layer.

2. The method of claim 1 wherein the dielectric layer comprises silicon dioxide.

3. The method of claim 1 wherein the layer of silicon is approximately twenty angstroms thick.

4. The method of claim 1 wherein the layer of silicon is sufficiently thick to substantially prevent tungsten hexafluorine from reacting with the dielectric layer.

5. The method of claim 1 wherein the act of forming the tungsten nitride layer includes reacting tungsten hexafluorine, nitrogen, and hydrogen.

6. The method of claim 5 wherein the act of forming the tungsten nitride layer includes adjusting a $N_2:WF_6$ gas flow ratio so as to produce in the tungsten nitride layer a ratio of nitrogen atoms to tungsten atoms (N:W) less than approximately 0.4.

7. The method of claim 5 wherein the act of forming the tungsten nitride layer includes adjusting a $N_2:WF_6$ gas flow ratio so as to produce in the tungsten nitride layer a ratio of nitrogen atoms to tungsten atoms (N:W) in the range of approximately 0.3 to 0.4.

8. The method of claim 5 wherein the act of forming the tungsten nitride layer includes adjusting a $N_2:WF_6$ gas flow ratio so as to produce in the tungsten nitride layer a ratio of nitrogen atoms to tungsten atoms (N:W) approximately equal to 0.3.

9. The method of claim 1 wherein the act of forming the tungsten nitride layer includes using a plasma enhanced chemical vapor deposition.

10. The method of claim 1 further comprising the act of forming a conductive layer over the tungsten nitride layer.

11. The method of claim 10 wherein the conductive layer includes copper.

12. The method of claim 10 wherein the conductive layer includes tungsten.

13. The method of claim 1 further comprising the act of forming a damascene structure in the dielectric layer.

14. The method of claim 13 wherein the damascene structure includes a via portion and a trench portion.

15. An integrated circuit fabrication method comprising the acts of:

providing a semiconductor substrate;

forming a dielectric layer over the semiconductor substrate;

forming a trench in the dielectric layer;

forming a layer of amorphous silicon over the dielectric layer in the trench;

forming a tungsten nitride layer on the layer of amorphous silicon;

forming an adhesion layer between the tungsten nitride layer and the dielectric layer, the adhesion layer comprising silicon nitride and tungsten silicide, wherein silicon in the silicon nitride and tungsten silicide is at least in part from the amorphous silicon layer; and forming a layer comprising copper over the tungsten nitride layer in the trench.

* * * * *